(12) United States Patent
Usami

(10) Patent No.: US 6,589,863 B1
(45) Date of Patent: Jul. 8, 2003

(54) SEMICONDUCTOR DEVICE AND MANUFACTURING METHOD THEREOF

(75) Inventor: Tatsuya Usami, Tokyo (JP)

(73) Assignee: NEC Electronics Corp. (JP)

( * ) Notice: Subject to any disclaimer, the term of this patent is extended or adjusted under 35 U.S.C. 154(b) by 0 days.

(21) Appl. No.: 09/471,760

(22) Filed: Dec. 23, 1999

(30) Foreign Application Priority Data

Dec. 25, 1998 (JP) ............................ 10-371329

(51) Int. Cl.$^7$ ..................... H01L 21/4763; H01L 21/44
(52) U.S. Cl. ..................... 438/626; 438/627; 438/637; 438/643; 438/653; 438/672; 438/688
(58) Field of Search .................... 438/626, 624, 438/627, 637, 638, 639, 640, 643, 652, 653, 672, 675, 678, 669, 629, 633, 656, 671, 685, 687, 688, 654, 622

(56) References Cited

U.S. PATENT DOCUMENTS

| | | | | |
|---|---|---|---|---|
| 5,187,119 A | * | 2/1993 | Cech et al. ............... | 438/626 |
| 5,354,712 A | * | 10/1994 | Ho et al. .................. | 438/643 |
| 5,451,551 A | * | 9/1995 | Krishman et al. ......... | 438/626 |
| 5,744,376 A | * | 4/1998 | Chan et al. ............... | 438/643 |
| 5,897,369 A | * | 4/1999 | Jun ......................... | 438/629 |
| 5,972,786 A | * | 10/1999 | Hoshino et al. .......... | 438/627 |
| 6,008,118 A | * | 12/1999 | Yeh et al. ................. | 438/629 |
| 6,100,184 A | * | 8/2000 | Zhao et al. ............... | 438/638 |
| 6,114,243 A | * | 9/2000 | Gupta et al. .............. | 438/687 |
| 6,117,769 A | * | 9/2000 | Nogami et al. ........... | 438/653 |
| 6,130,157 A | * | 10/2000 | Liu et al. .................. | 438/669 |
| 6,191,025 B1 | * | 2/2001 | Liu et al. .................. | 438/622 |
| 6,191,027 B1 | * | 2/2001 | Omura ..................... | 438/627 |
| 6,191,029 B1 | * | 2/2001 | Hsiao et al. .............. | 438/633 |
| 6,287,954 B1 | * | 9/2001 | Ashley et al. ............ | 438/622 |
| 6,316,359 B1 | * | 11/2001 | Simpson ................... | 438/678 |

FOREIGN PATENT DOCUMENTS

| | | | |
|---|---|---|---|
| EP | 000013728 A1 | * | 8/1980 |
| JP | 405198525 A | * | 8/1993 |
| JP | 405243222 A | * | 9/1993 |
| JP | 405259111 A | * | 10/1993 |
| JP | 405267475 A | * | 10/1993 |
| JP | 406029409 A | * | 2/1994 |
| JP | 406045453 A | * | 2/1994 |
| JP | 6-275612 | | 9/1994 |
| JP | 7-183300 | | 7/1995 |
| JP | 8-222568 | | 8/1996 |
| JP | 408222568 | * | 8/1996 |
| JP | 8-264538 | | 10/1996 |
| JP | 8298285 | | 11/1996 |
| JP | 9-283520 | | 10/1997 |
| JP | 9-326433 | | 12/1997 |

OTHER PUBLICATIONS

Japanese Office Action issued Feb. 28, 2001 in a related application with English translation of relevant portions.

* cited by examiner

Primary Examiner—Matthew Smith
Assistant Examiner—Chuong A. Luu
(74) Attorney, Agent, or Firm—Dickstein, Shapiro, Morin & Oshinksky, LLP

(57) ABSTRACT

There is presented a structure in which outlines of a metal interconnection 111 that is laid in an interlayer insulating film are covered with a barrier metal film 110. As the material for the barrier metal film 110, TaN or the like is utilized.

5 Claims, 13 Drawing Sheets

AFTER FORMING A CONDUCTIVE FILM

AFTER CHEMICAL MECHANICAL POLISHING

SEMICONDUCTOR DEVICE AND MANUFACTURING METHOD THEREOF

BACKGROUND OF THE INVENTION

1. Field of the Invention

The present invention relates to a multi-layered interconnection structure in which interconnections and plugs are provided in the form of damascene and a manufacturing method thereof.

2. Description of the Related Art

In recent years, as the LSI (Large Scale Integrated Circuit) achieves a still more densely spaced arrangement, techniques to form a multi-layered interconnection with a three-dimensional interconnection structure have been acquiring further importance. In the process flow of manufacturing a multi-layered interconnection, every step of depositing and working a metal, depositing an insulating film and applying planarization thereto, and forming a through hole and damascening by inlaying a metal therein must be performed at a temperature below the heat-proof temperature of each metal material. Moreover, the actual process must be designed to have simple and practical steps, while paying, at the same time, due regard to the yield and reliability of the final product thereby.

Meanwhile, in order to satisfy demands that the element should have a still higher speed, low-resistance materials such as copper have become in wide use. With copper, however, patterning by means of etching is difficult to perform. Therefore, when copper is used, an interconnection must be formed by a method different from the conventional method used for forming an Al interconnection.

Under such circumstances, extensive investigations are currently conducted over matters concerning a method of forming a damascene-type multi-layered interconnection that meets specific requirements of a new interconnection material such as copper.

Now, referring to FIGS. 8 to 12, a conventional method of forming a copper damascene interconnection structure is described herein below.

First, a lower layer interconnection is formed as follows. After a metal film 1 is formed on a semiconductor substrate (not shown in the drawings), a plasma $SiO_2$ film 2 (100 nm in thickness), a HSQ (Hydrogen Silisesquioxane) film 3 (400 nm in thickness), a plasma $SiO_2$ film 4 (100 nm in thickness), a HSQ film 5 (400 nm in thickness) and a plasma $SiO_2$ film 6 (200 nm in thickness) are formed thereon in this order (FIG. 8(a)). A photoresist 7 patterned into a prescribed shape is then formed over that (FIG. 8(b)). Using this photoresist 7 as a mask, dry etching is applied thereto so as to form a trench that reaches the metal film 1 (FIG. 8(c)). After that, a strip treatment of the photoresist 7 is carried out by means of ashing with the oxygen plasma and cleaning with a stripper containing amines. Next, a photoresist 7' having a wider opening than the width of this trench is formed (FIG. 8(d)), and another dry etching is applied thereto, using this photoresist 7' as a mask, and thereby a sectionally partially T-shaped trench is formed (FIG. 9(a)). After removing the photoresist 7' (FIG. 9(b)), a barrier metal film 8 (50 nm in thickness) made of TiN is deposited over the entire surface by the sputtering method (FIG. 9(c)). Further, over that, a seed film (not shown in the drawings) for the purpose of performing electroplating with copper is deposited to a thickness of 100 nm by the sputtering method, and thereon a copper film 10 (1000 nm in thickness) is grown by electroplating so as to fill up the trench section (FIG. 9(d)). Subsequently, portions of the copper film 10 as well as the barrier metal film 8 which are formed in a region other than the trench section are removed by the CMP (Chemical Mechanical Polishing) and thereby a lower layer interconnection is accomplished (FIG. 10(a)).

Over this lower layer interconnection, a SiN film 20 is formed by the plasma CVD (Chemical Vapour Deposition) method (FIG. 10(b)). This SiN film 20 serves as an etching stopper when a through hole between the lower layer and the upper layer interconnections is formed as described below. With the SiN film 20 being set, degradation of the lower layer interconnection at the time of formation of the through hole can be suppressed to a certain degree. Further, the SiN film can prevent metal particles of copper and the like from diffusing into an interlayer insulating film and giving adverse effects on the element. The film thickness of the SiN film 20 is normally 50 nm or so.

Next, an upper layer interconnection is formed in the similar way as the formation of the lower layer interconnection. A HSQ film 13 (400 nm in thickness), a plasma $SiO_2$ film 14 (100 nm in thickness), a HSQ film 15 (400 nm in thickness) and a plasma $SiO_2$ film 16 (200 nm in thickness) are formed in this order. A photoresist 17 patterned into a prescribed shape is then formed over that (FIG. 11(a)).

Using this photoresist 17 as a mask, dry etching is applied thereto. At this, owing to a difference in etching rate between the HSQ film 13 and the SiN film 20, the etching is stopped at the top section of the SiN film 20 (FIG. 11(a)). Following this, together with strip of the photoresist 17, the deposit produced by etching is removed, by means of ashing with the oxygen plasma and cleaning with a stripper. After that, a photoresist 17' having a wider opening than the width of this trench is formed, and another dry etching is performed, using this photoresist 17' as a mask, and thereby a sectionally partially T-shaped trench is formed (FIG. 11(b)). Next, the photoresist 17' as well as the etching deposit produced by etching are removed by means of oxygen plasma ashing and cleaning with a stripper. Next, the SiN film 20 is etched by dry etching, which exposes the copper film 10 (FIG. 11(c)). After that, cleaning with a stripper is again applied thereto and the etching deposit produced by this dry etching or the deposit of SiN origin is removed.

A barrier metal film 18 (50 nm in thickness) and a copper film 19 (1000 nm in thickness) are formed in this order so as to fill up completely the trench section which is formed as described above, and thereby the trench section is damascened. Subsequently, carrying out the planarization by the CMP, the multi-layered interconnection structure as shown in FIG. 12 is formed.

In the conventional technique describe above, a SiN film is formed over the lower layer interconnection with the object of providing an etching stopper film as well as suppressing diffusion of copper or the like. However, considering the following adverse points given by this film, further improvements yet remain to be made.

Firstly, the parasitic capacitance between interconnections on the same interconnection layer becomes considerably large owing to the fringe effect. FIG. 14 is a diagram to explain this phenomenon. Between the adjacent interconnections 50 and 51 at the same interconnection layer, there are present s parasitic capacitor 52 in which a $SiO_2$ film 54 serves as a dielectric film and a parasitic capacitor 53 in which a SiN film 55 serves as a dielectric film. Since the permittivity of the $SiO_2$ film is comparatively low, the effect of the parasitic capacitor 52 is relatively small. The permittivity of SiN is, however, approximately twice as much as that of SiO$_2$ so that the parasitic capacitor 53 has a large capacitance. In short, the presence of this parasitic capacitor 53 makes a cross talk between the interconnections 50 and 51 liable to happen.

Secondly, there are known to be problems such as degradation of the lower layer interconnection and contamination of the through hole which are apt to take place in the step of removing the SiN film. For the SiN film is an insulating film, the SiN film within the through hole must be removed. The removal of the SiN film is carried out by means of dry etching and, on that occasion, the deposit of SiN origin produced by this etching should be cleared off as well. Although the removal of the deposit of SiN origin can be normally made using a stripper for resist, this tends to cause degradation of the underlying interconnection, in turn. While copper, which has a low resistivity, is generally used as the interconnection material, a stripper that can remove the deposit of SiN origin without degrading copper has not be found yet. Consequently, it is hard to remove the above deposit without causing degradation of the copper surface.

Further, to simplify the steps in the manufacturing process, there may be employed a method in which the SiO$_2$ film and the SiN film are dry etched at once in the same step. In this instance, at the time of overetching performed to remove SiN thoroughly, the underlying lower layer interconnection is also etched. This degrades the surface of the lower layer interconnection and, in addition, gives rise to another problem that the etching deposit resulting from this etching is attached to the inside wall of the hole. The main component of this etching deposit is a substance produced by a reaction of the metal material constituting the lower layer interconnection and the etching gas and very difficult to remove by any normal method of cleaning. Yet, if the etching deposit of this sort remains, it brings about problems such that the leakage current may flow in the interlayer insulating film and an element formed under the interlayer insulating film such as a transistor may make an error operation.

Further, in the case that the deposit of SiN origin or the etching deposit is left in the through hole, the contact metal resistance may become extremely high and stop the current flow.

As described above, setting the SiN film itself causes various problems.

However, if an etching stopper such as SiN is not set therein at all, the lower layer interconnection becomes exposed on the occasion of dry etching while forming a through hole as well as on the occasion of ashing and a wet treatment in the step of removing a mask so that the surface thereof becomes heavily degraded.

In light of the above problems, an object of the present invention is to provide a multi-layered interconnection structure of high quality, wherein neither parasitic capacitor due to the fringe effect is brought about nor degradation of the lower layer interconnection or contamination of the through hole takes place.

SUMMARY OF THE INVENTION

In accordance with an aspect of the present invention, there is provided a semiconductor device, comprising:
a metal interconnection set on a semiconductor substrate; and
a via plug formed to connect with the upper surface of said metal interconnection;
outlines of said metal interconnection being covered with a barrier metal film.

Because outlines of the metal interconnection of this semiconductor device are covered with a barrier metal film, the metal interconnection hardly suffers damage in the manufacturing steps and, thus, shows excellent characteristics. Further, in this semiconductor device, when a through hole for the plug is formed onto the metal interconnection, the etching deposit difficult to remove can be effectively prevented from being produced.

This solves such problems as the leakage current may flow in an interlayer insulating film and an element formed under the interlayer insulating film such as a transistor may make an error operation. Furthermore, an increase in contact metal resistance that occurs if the etching deposit is left in the through hole can be avoided.

Here, a structure in which outlines of a metal interconnection are covered with a barrier metal film is illustrated in FIG. 1. As shown in the drawing, a metal interconnection 111 is covered with a barrier metal film 110. As used in the present invention, a structure in which "outlines of a metal interconnection are covered with a barrier metal film", refers to a structure in which all sides of the metal interconnection, that is, the upper and lower surfaces and all lateral faces thereof are all covered with a barrier metal film 110, as shown in the drawing. In the conventional interconnection structure, as shown in FIG. 13, the upper surface of a metal interconnection 31 is not covered with a barrier metal film 30, and an etching film 32 made of a SiN film or the like is formed thereon instead. This results in the very problem that damage to the metal interconnection 31 or contamination of a through hole formed thereto may be brought about in the steps of manufacturing the multi-layered interconnection. In contrast with this, in the present invention, the upper surface of the metal interconnection is also covered with a barrier metal film so that a problem of this sort can be eliminated. Further, with the structure in which outlines thereof are covered with a barrier metal film, metal such as copper can be effectively prevented from diffusing into an interlayer insulating film.

Further, in accordance with an aspect of the present invention, there is provided a semiconductor device having a plurality of interconnection layers on a semiconductor substrate;
one of said interconnection layers comprising a plurality of metal interconnections with various line widths and a plurality of via plugs formed to connect with the upper surface of said plural metal interconnections;
outlines of said plural metal interconnections being covered with barrier metal films.

Normally, in a multi-layered interconnection structure, a plurality of metal interconnections with various line widths are formed within one of the interconnection layers (FIG. 16). It is preferable that these plural metal interconnections each have a structure in which outlines of each are individually covered with a barrier metal film. With this arrangement, damage to the metal interconnections in the manufacturing steps can be effectively avoided, and metal interconnections and thorough plugs, both having excellent characteristics, can be obtained. That is, by covering outlines of metal interconnections having various line widths with respective barrier metal films, as described above, damage to the metal interconnections in the manufacturing steps can be avoided and contamination of thorough holes for plugs, prevented.

The structure in which outlines of a plurality of metal interconnections with various line widths that are laid within one of the interconnection layers are individually covered with respective barrier metal films can be obtained only by a novel manufacturing process that differs from the conventional damascene process. In the present invention, the above structure is accomplished by employing a recess formation technique described below.

Further, in the above semiconductor device, though it is preferable to have a structure in which, among a plurality of metal interconnections having various line widths, all or the majority thereof are covered with barrier metal films, it is possible to have a structure in which only a part thereof are covered with barrier metal films.

Further, in accordance with an aspect of the present invention, there is provided a method of manufacturing a semiconductor device, comprising the steps of:

forming a caved-in section at a prescribed position in a first interlayer insulating film laid on a semiconductor substrate;

forming a first barrier metal film over the entire surface and thereafter forming a first conductive film so as to fill up said caved-in section completely in substance;

forming a recess by removing an upper section of the first conductive film that fills said caved-in section, together with removing a portion of the first conductive film formed in a region other than said caved-in section;

forming a second barrier metal film over the entire surface so as to fill up the recess;

removing portions of the first barrier metal film and the second barrier metal film which are formed in a region other than said caved-in section;

forming a second interlayer insulating film over the entire surface;

forming, in the second interlayer insulating film, a through hole that reaches the second barrier metal film; and forming a second conductive film so as to fill up said through hole.

In this method of manufacturing a semiconductor device, a recess is formed by removing an upper section of the first conductive film that fills the caved-in section and then a second barrier metal film so as to fill up the recess, and thereafter portions of the first barrier metal film and the second barrier metal film which are formed in a region other than the caved-in section are removed. By way of these steps, a metal interconnection whose outlines are covered with a barrier metal film can be formed fittingly. After the metal interconnection with such a structure is formed, a through hole and an upper layer interconnection are formed thereon so that the metal interconnection hardly suffers damage in the manufacturing steps. Therefore, a metal interconnection having excellent characteristics can be obtained. Further, a through hole formed onto this metal interconnection is hard to receive metal contamination in the manufacturing steps, thus achieving high quality.

In the present invention, in forming a metal interconnection with a structure in which outlines thereof are covered with a barrier metal film., a means of forming a recess is utilized. That is, after a first conductive film is formed so as to fill up the caved-in section completely in substance, a recess is formed by removing an upper section of the first conductive film and then a second barrier metal film is formed in the part of this recess, and thereby the structure mentioned above is formed. The term "a recess" refers to a sunken section having a form shown in FIG. 4(a) and it takes the configuration of a lower step as against other regions. By forming such a recess, the above structure can be achieved for certain regardless of the geometry of the caved-in section. Further, this method allows to cover individual outlines of a plurality of metal interconnections having various line widths that are laid within one of the interconnection layers with respective barrier metal films simultaneously in one and the same step.

As described above, in the present invention, after a first conductive film is formed so as to fill the caved-in section completely in substance, a recess is formed by removing a section of the first conductive film. At this, it is also possible to form a shape resembling a recess by reducing the film thickness of the first conductive film. FIG. 15 illustrates such a step. First, after a partially T-shaped trench is formed in an interlayer insulating film 40, a barrier metal film 41 and a conductive film 42 are formed so as to fill up this trench in the form of damascene (FIG. 15(a)), and then, by performing the CMP, a dishing section 43 resembling a recess is formed (FIG. 15(b)). However, in this method, the shape of the damascene section tends to reflect the original shape of the caved-in section and to become dishing-shaped with the edge sections being upraised. The dishing basically differs from the recess and, unlike the recess, its upper surface cannot be covered with a barrier metal film and, in consequence, the effects of the present invention cannot be obtained. Further, with the technique described above, it is extremely difficult to cover a plurality of caved-in sections having various line widths that are laid within the identical interconnection layer with respective barrier metal films simultaneously in one and the same step. This owes to a fact that, if respective metal films are inlaid, in the form of damascene, into a plurality of caved-in sections having various line widths, there are left two sets of trenches, one in which a recess or a form resembling a recess is formed and the other in which neither is formed (FIG. 17).

Accordingly, the formation of a recess with the object of covering the upper surface of the metal interconnection with a barrier metal is preferably carried out in the step wherein a first conductive film is first formed so as to fill up the caved-in section completely in substance and thereafter an upper section of the first conductive film is removed.

As described above, in the present invention, since outlines of a metal interconnection is covered with a barrier metal film, the metal interconnection hardly suffers damage in the step of forming a through hole. Moreover, the through hole formed onto the metal interconnection is hard to receive metal contamination in the manufacturing steps. In consequence, a multi-layered interconnection structure having excellent characteristics can be obtained.

DETAILED DESCRIPTION OF THE PREFERRED EMBODIMENTS

Figure 16:
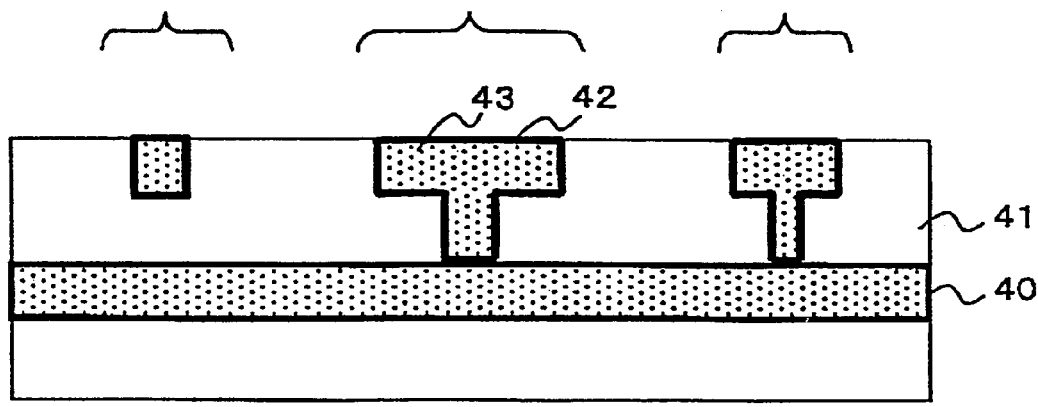
FIG. 16 is a schematic cross-sectional view illustrating an interconnection structure of the present invention.
Figure 17A:
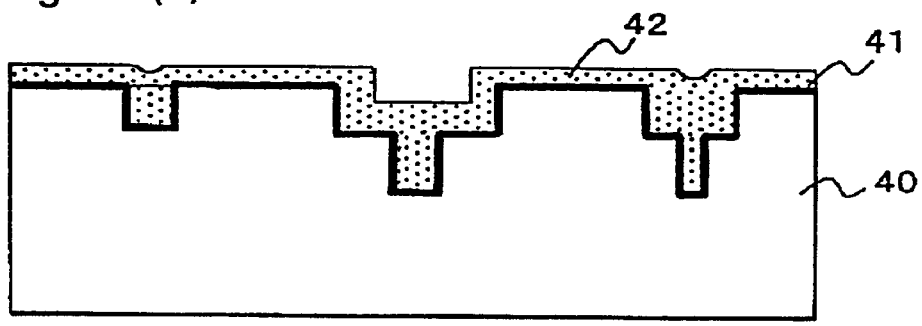
FIG. 17 is a series of schematic cross-sectional views in explaining the steps of forming conventional interconnections.
Figure 17B:
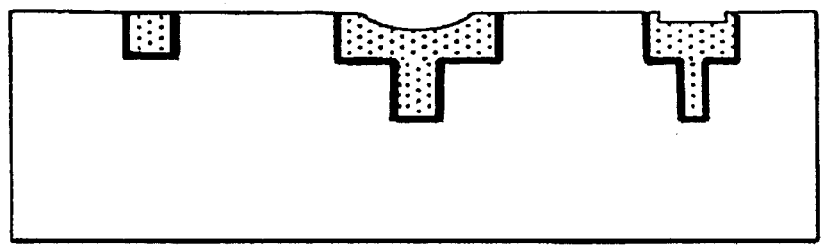

In the present invention, the metal interconnection formation process can be a single damascene process or a dual damascene process. Accordingly, in the present invention, the cross-section of the metal interconnection can be partially rectangular or T-shaped. FIG. 16 illustrates schematically various shapes of interconnections formed through the use of different processes. Interconnection 1 is formed through a single damascene process and rectangular in cross-section. Interconnections 2 and 3 are formed through a double damascene process and partially T-shaped in cross-section.

In a semiconductor device of the present invention, outlines of the metal interconnection are preferably covered with a barrier metal film made of a single material. Further, in a method of manufacturing a semiconductor device of the present invention, it is preferable that the first barrier metal film and the second barrier metal film are made of the identical material. With such an arrangement taken, a well-shaped metal interconnection can be formed in simple and practical steps. As compared with this, in the case that a barrier metal film with a double-layered structure is formed under the metal interconnection and on the lateral faces thereof, a stepped gap tends to appear in the step of planarizing the upper surface of the interconnection and, consequently, to cause a fault in damascene or the like in the later step of forming an interlayer insulating film.

The metal interconnection in a semiconductor device of the present invention as well as the first and the second conductive films in a manufacturing method of a semiconductor device of the present invention are preferably made of a metal material with a low resistivity. For example, a copper-based metal film, a silver-based metal film or the like is preferably utilized. As used herein, a copper-based metal film refers to a film of copper or copper alloy and a silver-based metal film, a film of silver or silver-based alloy. When a low-resistivity material of this sort is used, an interconnection with excellent characteristics can be produced but, on the other hand, it used to be susceptible to damage in the step of forming a through hole. Against this, as the present invention can eliminate the problem of damage in the step of forming a through hole, excellent characteristics of the above materials can be put to good use to the full. Further, if the interconnection is formed with copper, the copper film can be grown by the electroplating method, the CVD method, the sputtering method or the like.

The barrier metal film in the present invention is a film having a function of preventing the metal inlaid in the form of damascene within a through hole from diffusing out. For instance, Ti, TiN, TiSiN, W, WN, WSiN, Ta, TaN, TaSiN or the like can be employed for the film. Ta, TaN or TaSiN is preferably used among them, because any of these has a high polishing rate for the CMP or the like and facilitates to form a recess therein fittingly.

In a manufacturing method of a semiconductor device according to the present invention, the first barrier metal film and the second barrier metal film can be of the same material or different materials. As for the material of the first barrier metal film, Ta, TaN or TaSiN is preferable by the above reason.

In a manufacturing method of a semiconductor device according to the present invention, a through hole is formed, for instance, by means of dry etching. When a through hole is formed by dry etching in the prior art, the underlying interconnection layer is exposed, which results in a problem that the etching deposit difficult to clean is produced through dry etching and attached to the inside wall of the through hole. In contrast with this, in the present invention, the upper surface of the interconnection layer is covered with the barrier metal film so that such a problem as described above cannot happen.

In a manufacturing method of a semiconductor device according to the present invention, the removal of the portion of the first conductive film formed in a region other than the caved-in section as well as the formation of a recess are preferably carried out by the CMP. When copper or the like is employed as the material for the conductive film, the planarization can be brought about well through the use of the CMP. Further, by selecting conditions appropriately, a recess can be formed fittingly.

In forming a recess in the present invention, it is preferable to make the etching selection ratio of the conductive film to the barrier metal film high, this providing the condition in which the barrier metal film is more easily polished. One method to achieve such a condition is an appropriate selection of a material for the barrier metal film. For such a damascene-type conductive film as in the present invention, copper with a low resistivity is generally used. In this case, if Ta-based barrier metal film mentioned above is employed, the copper film or the conductive film becomes more apt to be polished selectively and the formation of the recess, easier.

Further, other methods to achieve the above conditions include variation of the composition in a polishing solution, an adjustment of the polishing pressure or the like. If the composition of the polishing solution, the polishing pressure or the like is controlled appropriately according to the material of the barrier metal film, the etching selection ratio can be raised and the recess can be formed fittingly.

FIRST EXAMPLE

Referring to FIGS. 2 to 6, the present example is described. In the present example, both the lower layer interconnection and the upper layer interconnection have a copper damascene interconnection structure. In short, this one is an example wherein a so-called dual damascene process is utilized.

FORMATION OF LOWER LAYER INTERCONNECTION

First, a lower layer interconnection was fabricated as follows.

Figure 2A:
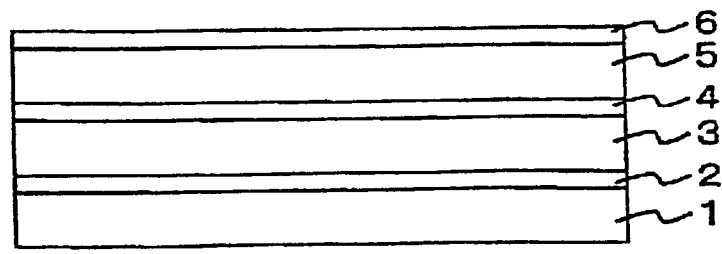
FIG. 2 is a series of schematic cross-sectional views illustrating the steps of a method of manufacturing a semiconductor device of the present invention.
Figure 2B:
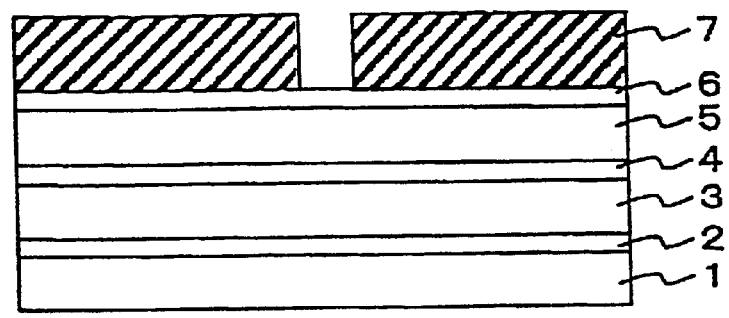
Figure 2C:
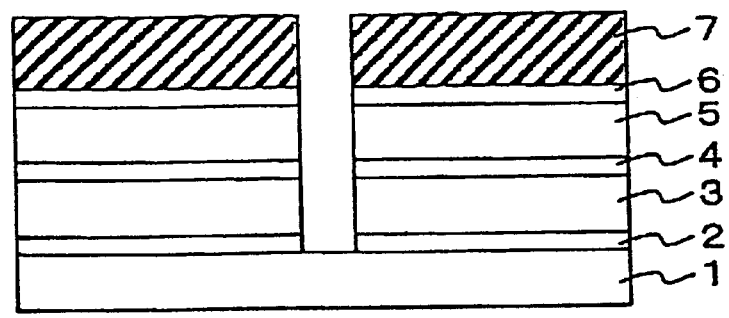
Figure 2D:
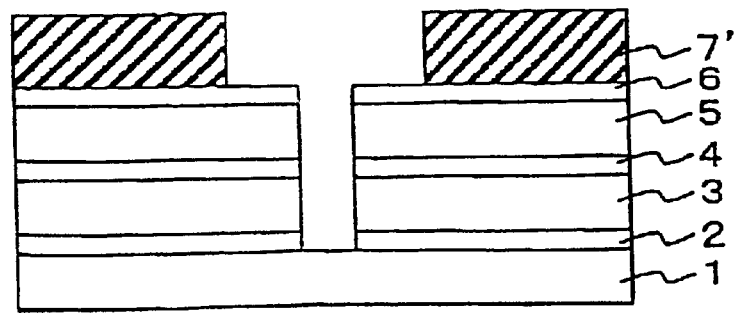

After a metal film 1 was formed on a semiconductor substrate (not shown in the drawings), a plasma $SiO_2$ film 2 (100 nm in thickness), a HSQ film 3 (400 nm in thickness), a plasma $SiO_2$ film 4 (100 nm in thickness), a HSQ film 5 (400 nm in thickness) and a plasma $SiO_2$ film 6 (100 nm in thickness) were formed thereon in this order (FIG. 2(a)). A photoresist 7 patterned into a prescribed shape was then formed over that (FIG. 2(b)). Using this as a mask, dry etching was applied thereto so as to form a trench that reached the metal film 1 (FIG. 2(c)). After that, a strip treatment of the photoresist 7 was carried out by means of ashing with the oxygen plasma and cleaning with a stripper containing amines. Next, a photoresist 7' having a wider opening than the width of this trench was formed (FIG. 2(d)), and another dry etching was applied thereto, using this photoresist 7' as a mask. At this, it is preferable to use an etching gas that makes an etching ratio of the HSQ film to the plasma $SiO_2$ film high to stop the etching at the top section of the plasma $SiO_2$ film 4. In the present example, a mixed gas containing $C_4F_8$, Ar and $O_2$ was utilized. Now, a sectionally partially T-shaped trench was formed (FIG. 3(a)).

Figure 3A:
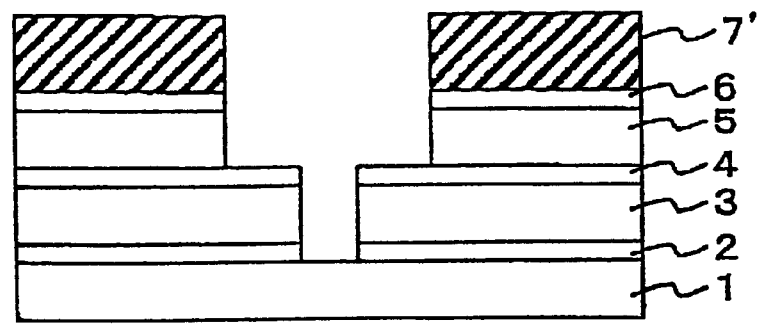
FIG. 3 is a series of schematic cross-sectional views illustrating further steps of the method of manufacturing the semiconductor device of the present invention.
Figure 3B:
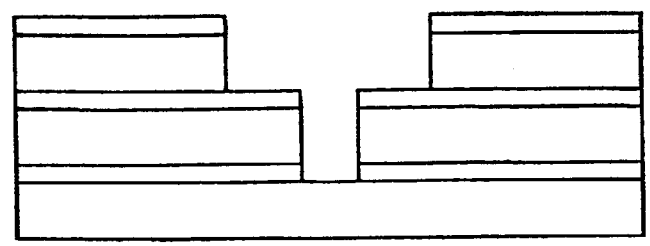
Figure 3C:
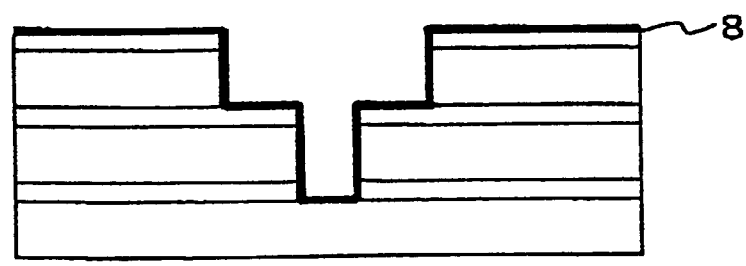
Figure 3D:
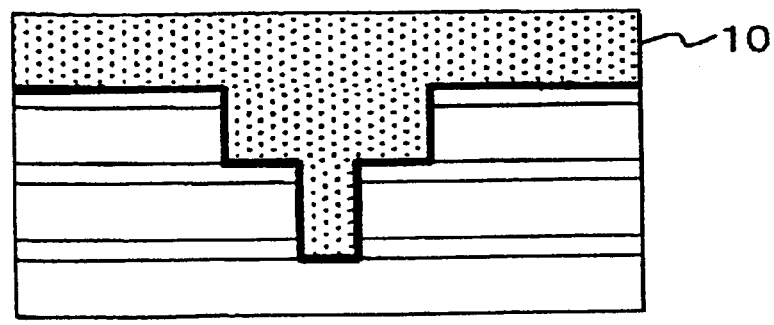

After removing the photoresist 7' (FIG. 3(b)), a barrier metal film 8 (50 nm in thickness) made of TaN was deposited over the entire surface by the sputtering method (FIG. 3(c)). Further, over that, a seed film (not shown in the drawings) for the purpose of performing electroplating with copper was deposited by the sputtering method, and then a copper film 10 (1000 nm in thickness) was formed by the electroplating method so as to fill up the trench section completely (FIG. 3(d)). Subsequently, together with a portion of the copper film 10 formed in a region other than the trench section, an upper section of the copper film 10 filling the trench section was removed by the CMP, and thereby a recess 25 was formed (FIG. 4(a)). The depth of the recess was set to be 40 nm or so.

Figure 4A:
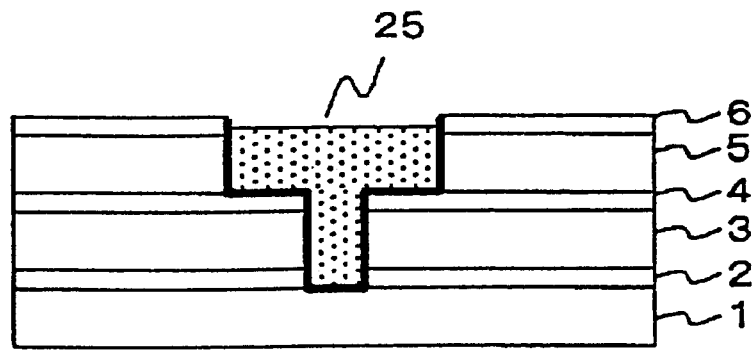
FIG. 4 is a series of schematic cross-sectional views illustrating further steps of the method of manufacturing the semiconductor device of the present invention.
Figure 4B:
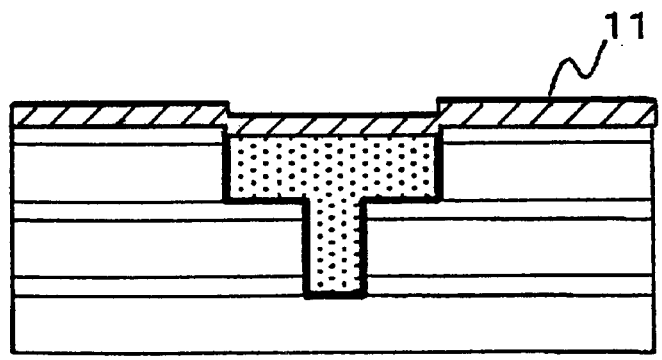
Figure 4C:
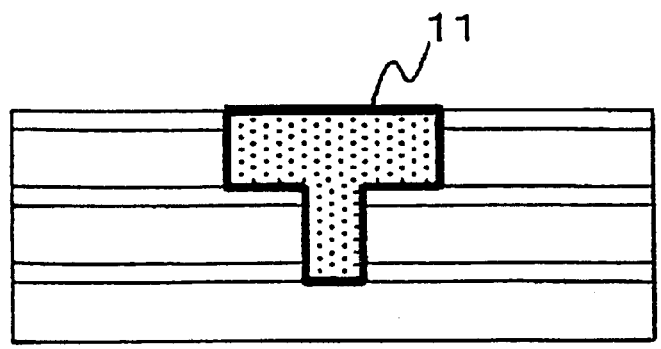
Figure 5A:
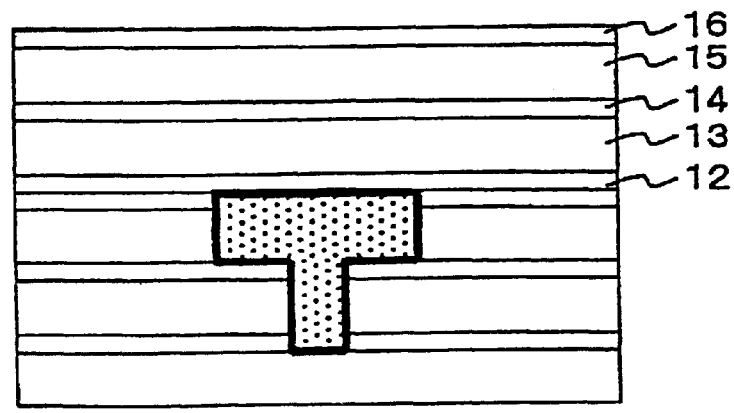
FIG. 5 is a series of schematic cross-sectional views illustrating further steps of the method of manufacturing the semiconductor device of the present invention.
Figure 5B:
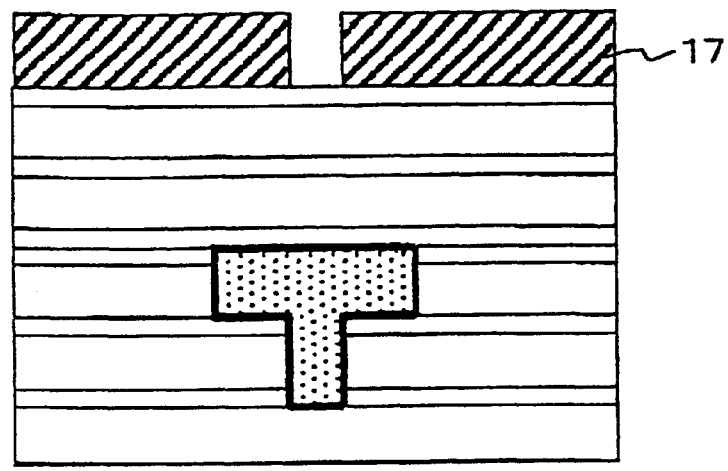

Next, using the sputtering method, a barrier metal 11 (50 nm in thickness) made of TaN was deposited over the entire surface (FIG. 4(b)). Subsequently, the portions of the barrier metal film 11 and the barrier metal film 8 that were formed in a region other than the trench section were removed by the CMP, and thereby a lower layer interconnection was formed (FIG. 4(c)).

FORMATION OF UPPER LAYER INTERCONNECTION

Next, an upper layer interconnection was formed in the similar manner as the formation of the lower layer interconnection. Firstly, a plasma $SiO_2$ film 12 (100 nm in thickness), a HSQ film 13 (400 nm in thickness), a plasma $SiO_2$ film 14 (100 nm in thickness), a HSQ film 15 (400 nm in thickness) and a plasma $SiO_2$ film 16 (100 nm in thickness) were formed in this order (FIG. 5(a)). A photoresist 17 patterned into a prescribed shape was then formed over that (FIG. 5(b)). Using this photoresist 17 as a mask, dry etching was applied thereto so as to form a trench that reached the lower layer interconnection (FIG. 6(a)).

Figure 1:
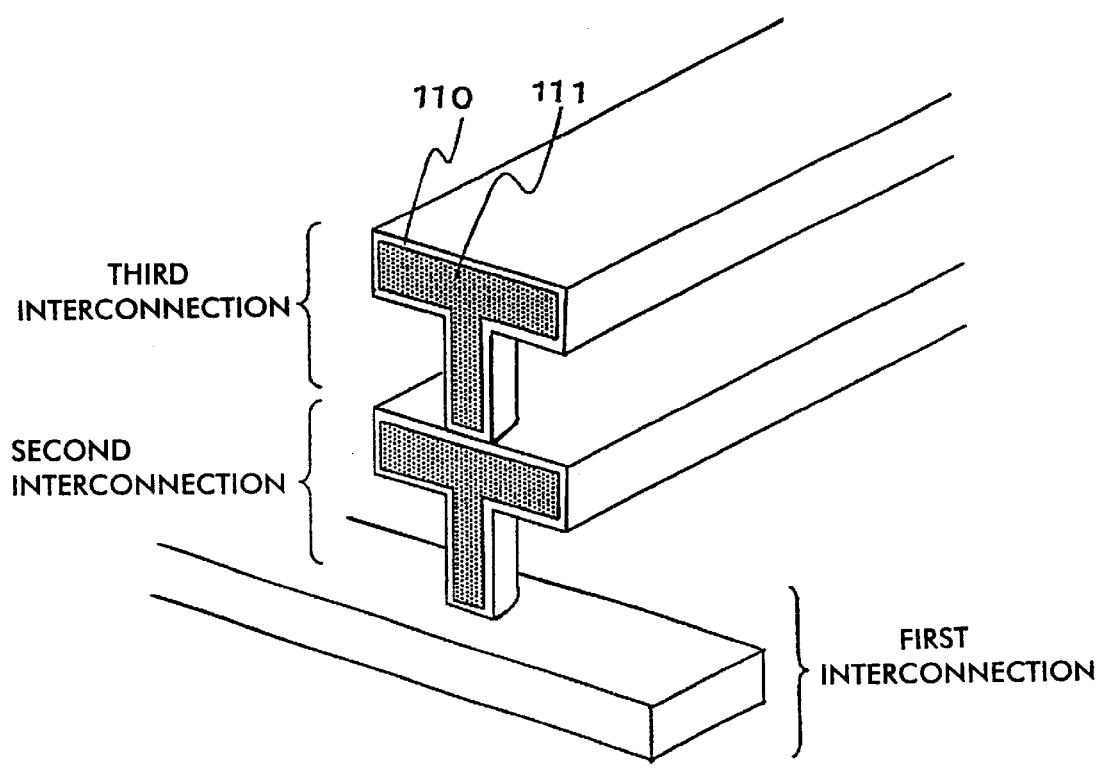
FIG. 1 is a schematic view illustrating a multi-layered interconnection structure in accordance with the present invention.
Figure 6A:
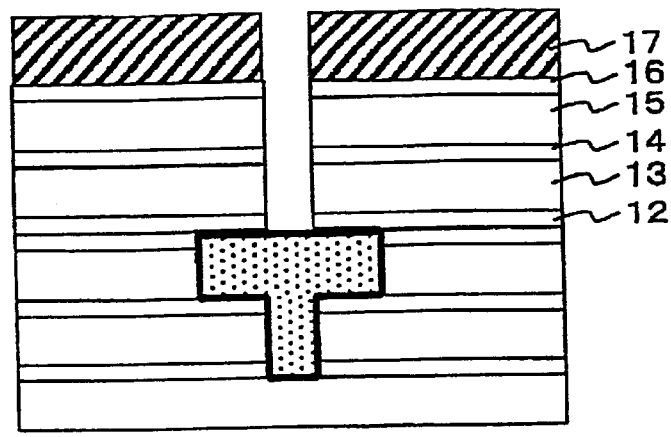
FIG. 6 is a series of schematic cross-sectional views illustrating further steps of the method of manufacturing the semiconductor device of the present invention.
Figure 6B:
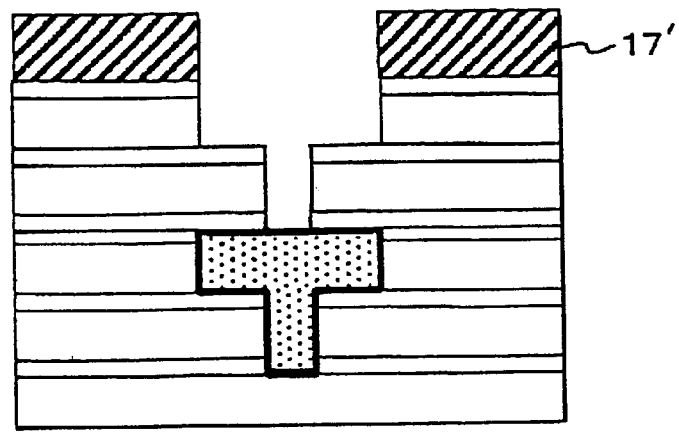
Figure 7:
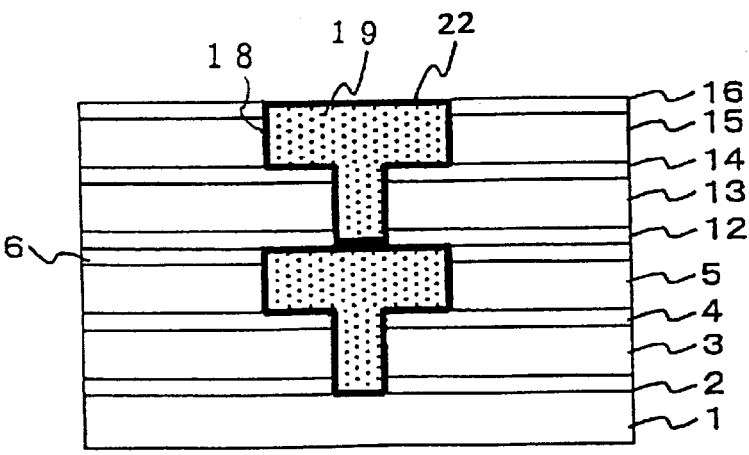
FIG. 7 is a schematic cross-sectional view illustrating the further step of the method of manufacturing the semiconductor device of the present invention.
Figure 8A:
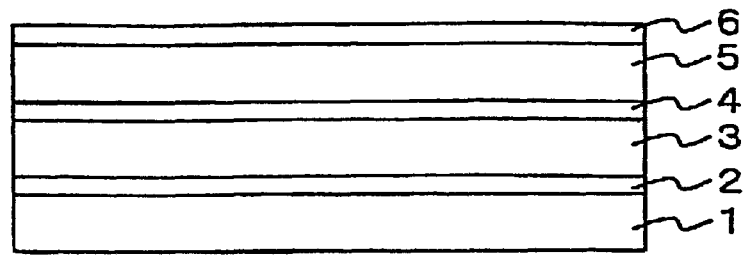
FIG. 8 is a series of schematic cross-sectional views illustrating the steps of a conventional method of manufacturing a semiconductor device.
Figure 8B:
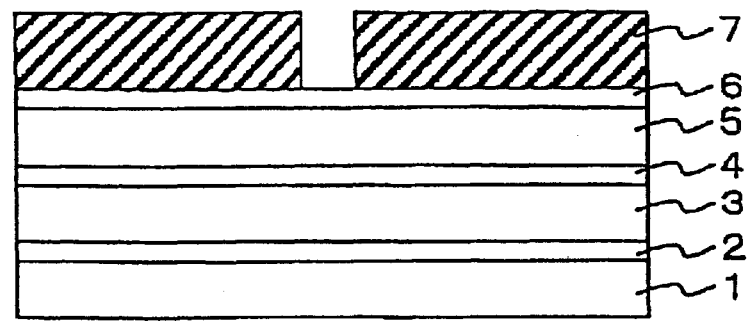
Figure 8C:
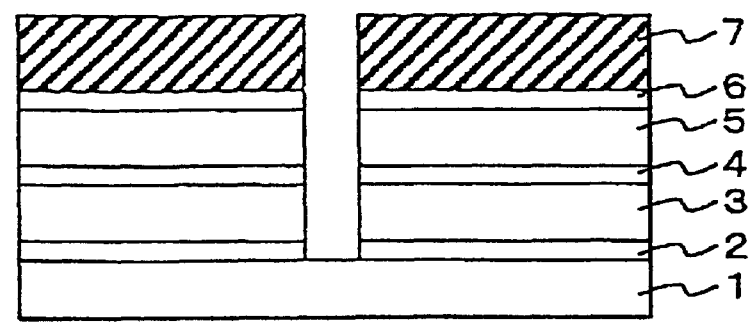
Figure 8D:
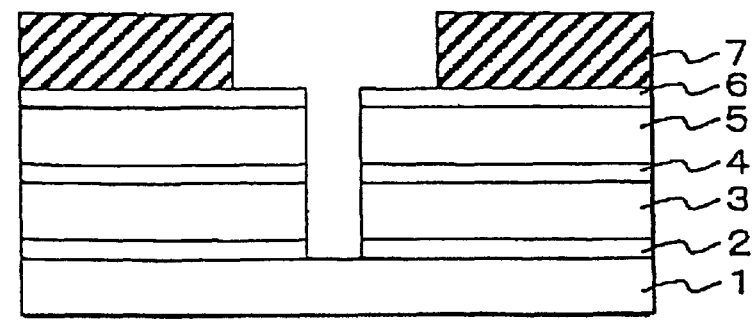
Figure 9A:
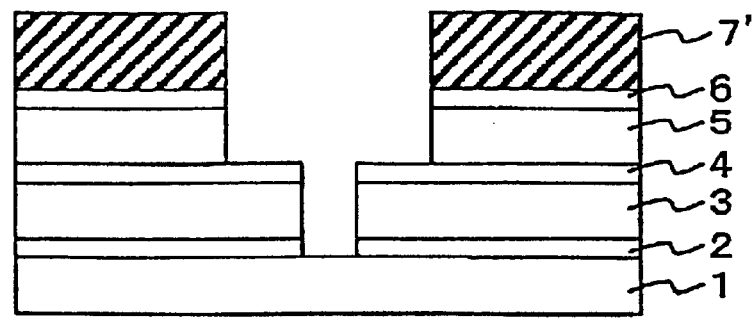
FIG. 9 is a series of schematic cross-sectional views illustrating further steps of the conventional method of manufacturing the semiconductor device.
Figure 9B:
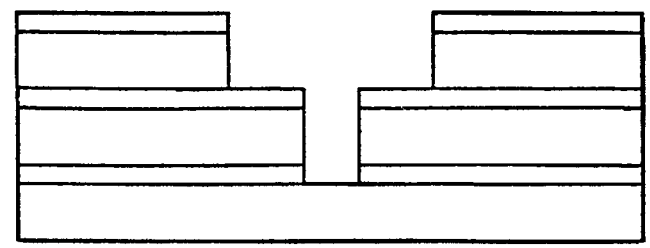
Figure 9C:
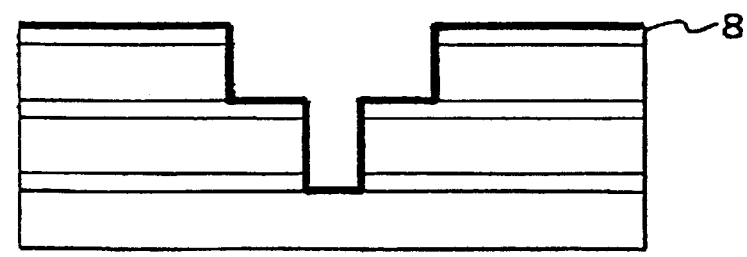
Figure 9D:
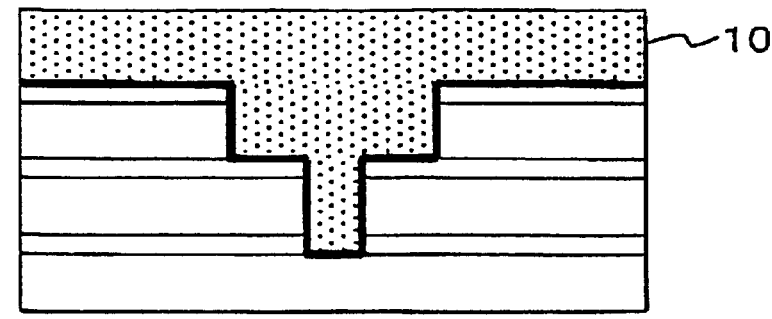
Figure 10A:
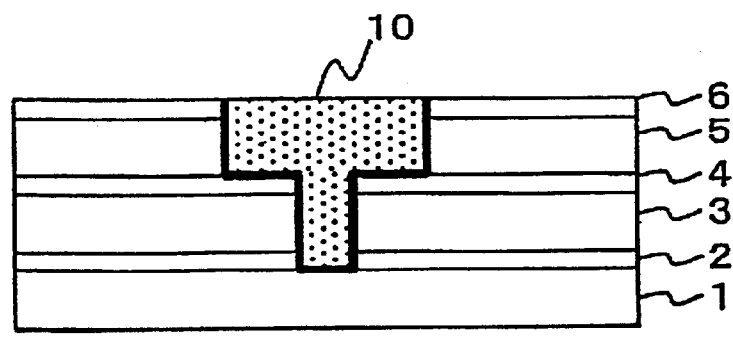
FIG. 10 is a series of schematic cross-sectional views illustrating further steps of the conventional method of manufacturing the semiconductor device.
Figure 10B:
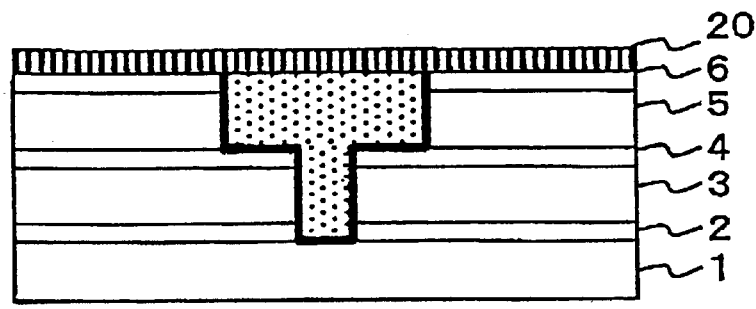
Figure 11A:
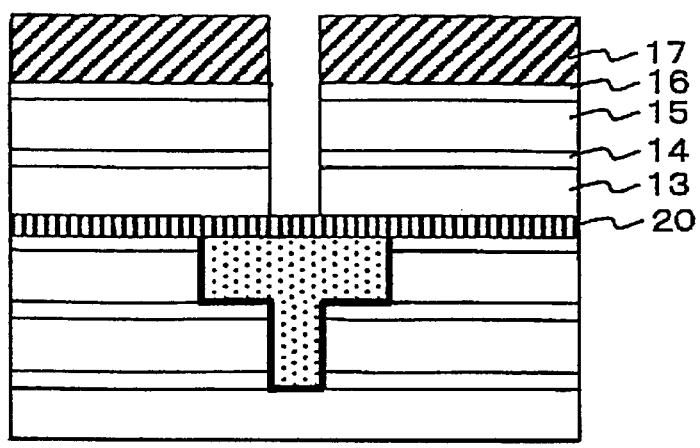
FIG. 11 is a series of schematic cross-sectional views illustrating further steps of the conventional method of manufacturing the semiconductor device.
Figure 11B:
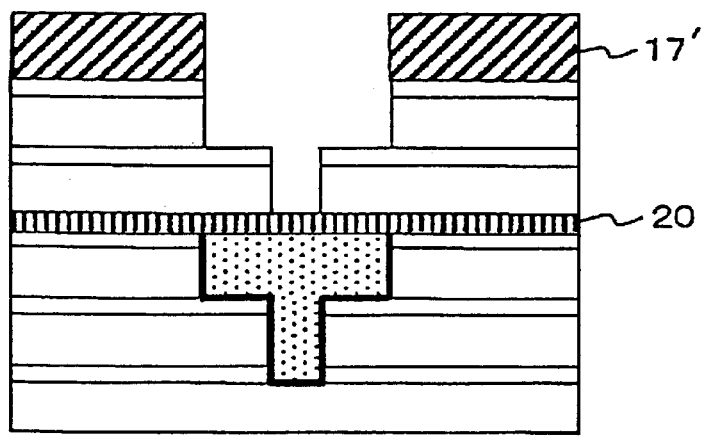
Figure 11C:
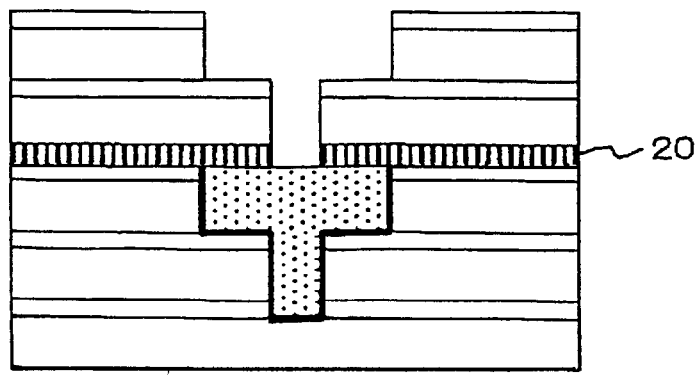
Figure 12:
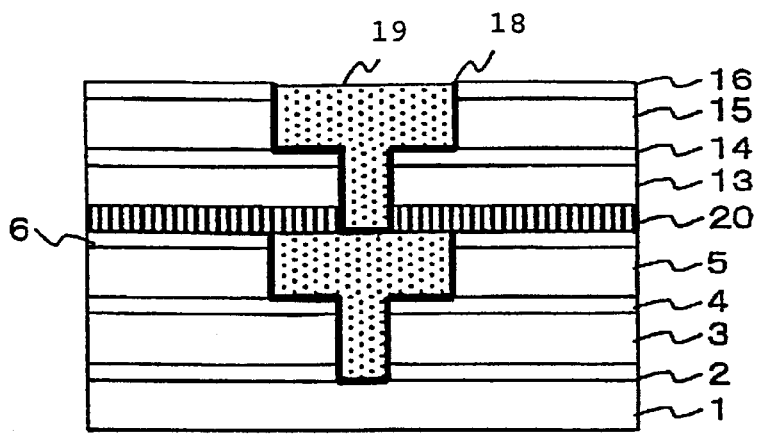
FIG. 12 is a schematic cross-sectional view illustrating further step of the conventional method of manufacturing the semiconductor device.
Figure 13:
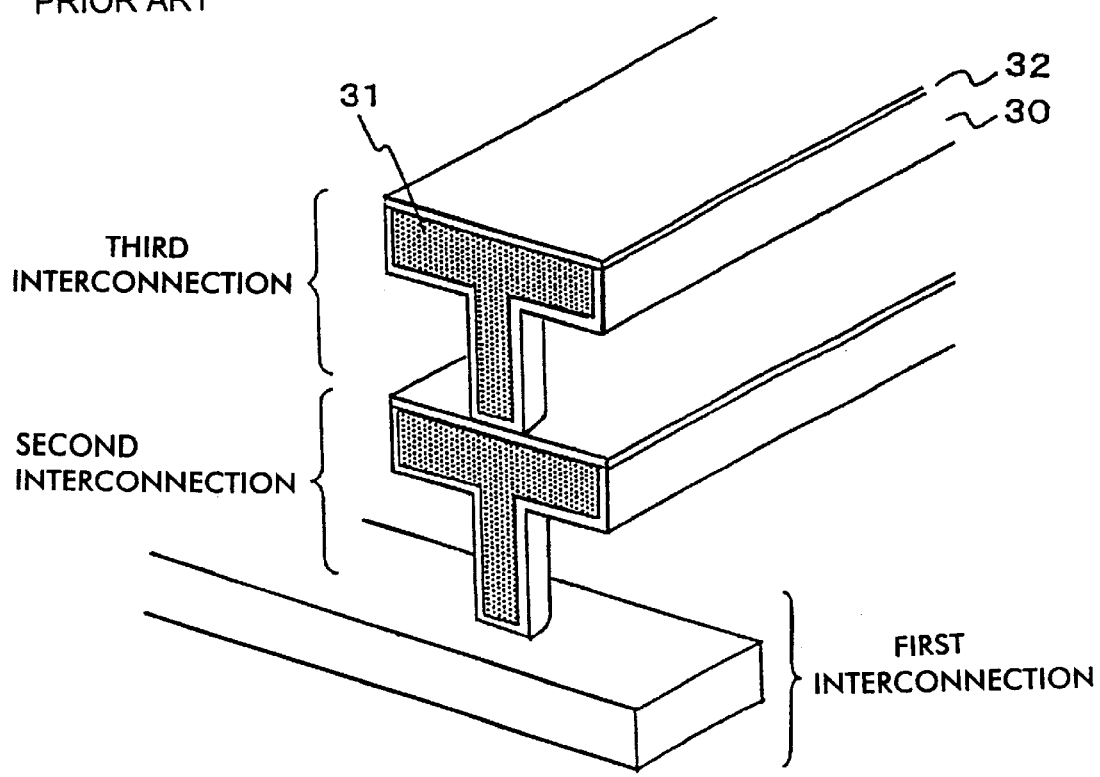
FIG. 13 is a schematic view illustrating a multi-layered interconnection structure of the prior art.
Figure 14:
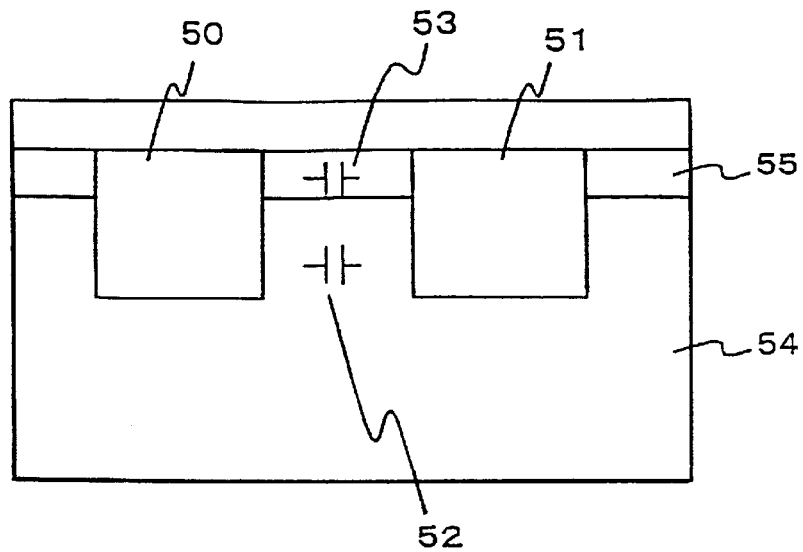
FIG. 14 is a diagram in explaining a problem associated with the interconnection structure in which a SiN film is set.
Figure 15A:
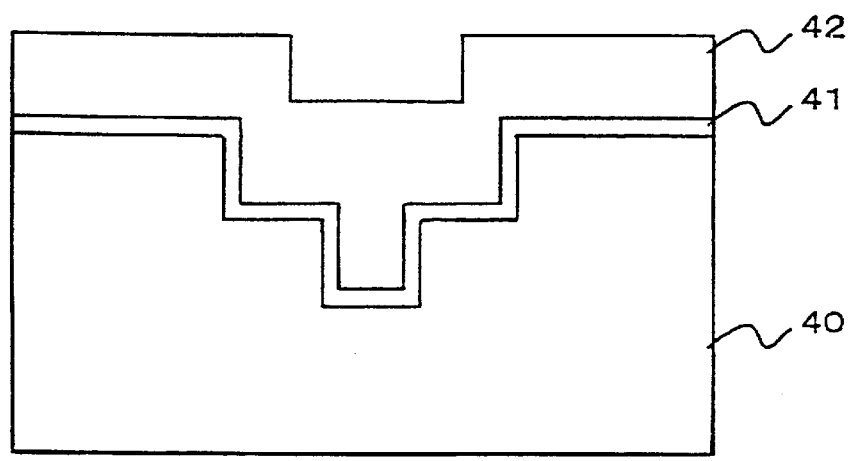
FIG. 15 is a series of schematic cross-sectional views illustrating the step of forming into a shape resembling a recess.
Figure 15B:
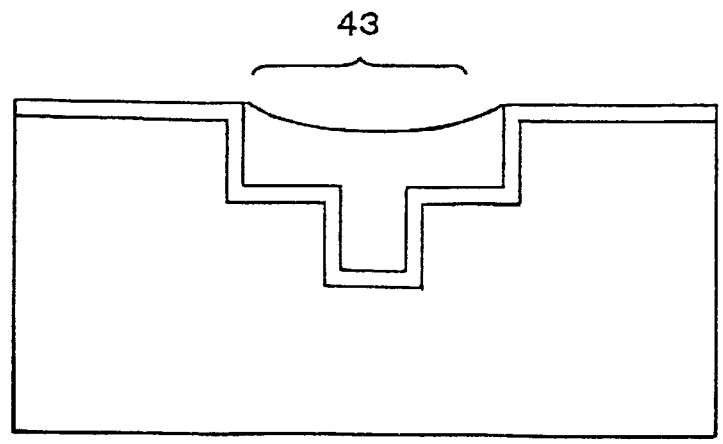

After a strip treatment of the photoresist 17 was carried out by means of ashing with the oxygen plasma and cleaning with a stripper, a photoresist 17' having a wider opening than the width of this trench was formed (FIG. 6(b)), and then another dry etching was applied thereto, using this photoresist 17' as a mask, and thereby a sectionally partially T-shaped trench was formed. After that, a barrier metal film 18 (50 nm in thickness) made of TaN and a copper film 19 (1000 nm in thickness) were formed in this order so as to fill up the trench section completely. Following planarization by the CMP and formation of a recess, a barrier metal film 22 (50 nm in thickness) made of TaN was deposited over the entire surface and then the CMP was again applied thereto, and thereby a multi-layered interconnection structure as shown in FIG. 7 was formed. FIG. 1 is a schematic perspective view of this multi-layered interconnection structure. As clearly seen in the drawing, outlines of a metal interconnection 111 is covered with a barrier metal film 110.

The multi-layered interconnection structure manufactured as described above did not have any of those problems such as the current leakage, the increase in resistance of the through hole or the parasitic capacitor, and showed excellent characteristics with low resistance.

Further, while the present example was described using, as an example, a method of manufacturing a multi-layered interconnection which comprises a dual damascene process, it is to be understood that the present invention can be applied to other processes such as a single damascene process.

This application is based on Japanese patent application NO.HEI10-371329, the content of which is incorporated hereinto by reference.

What is claimed is:

1. A method of manufacturing a semiconductor device, comprising the steps of:

forming a caved-in section at a prescribed position in a first interlayer insulating film laid on a semiconductor substrate;

forming a first barrier metal film of a Ta-based material over the entire surface and thereafter forming a first conductive film of a copper-based metal so as to fill up said caved-in section completely in substance;

forming a recess by removing an upper section of the first conductive film that fills said caved-in section, together with removing a portion of the first conductive film formed in a region other than said caved-in section, which is carried out by means of chemical mechanical polishing;

forming a second barrier metal film that is made of a material identical to the first barrier metal film over the entire surface so as to fill up the recess;

removing portions of the first barrier metal film and the second barrier metal film which are formed in a region other than said caved-in section;

forming a second interlayer insulating film over the entire surface;

forming, in the second interlayer insulating film, a through hole that reaches the second barrier metal film; and forming a second conductive film so as to fill up said through hole.

2. The method of manufacturing a semiconductor device according to claim 1, wherein said through hole is formed by means of dry etching.

3. The method of manufacturing a semiconductor device according to claim 1, wherein the first conductive film consists of copper or copper alloy.

4. The method of manufacturing a semiconductor device according to claim 1, wherein the first barrier metal film consists of Ta, TaN or TaSiN.

5. The method of manufacturing a semiconductor device according to claim 1, wherein the recess is formed by means of chemical mechanical polishing under conditions where removal from the first conductive film is high in comparison with the first barrier metal film.

* * * * *